(12) United States Patent
Lu

(10) Patent No.: US 6,756,641 B2
(45) Date of Patent: Jun. 29, 2004

(54) THIN-FILM-TRANSISTOR ORGANIC ELECTROLUMINESCENT DEVICE

(75) Inventor: Tien-Rong Lu, Tainan (TW)

(73) Assignee: RiTdisplay Corporation, Hsin Chu Industrial Park (TW)

( * ) Notice: Subject to any disclaimer, the term of this patent is extended or adjusted under 35 U.S.C. 154(b) by 0 days.

(21) Appl. No.: 10/427,958

(22) Filed: May 2, 2003

(65) Prior Publication Data

US 2003/0205709 A1 Nov. 6, 2003

(30) Foreign Application Priority Data

May 3, 2002 (TW) ........................................ 91109294 A

(51) Int. Cl.$^7$ ........................ H01L 27/01; H01L 27/12; H01L 31/0392; H01L 29/04; H01L 31/036
(52) U.S. Cl. ............................ 257/350; 257/59; 257/72
(58) Field of Search ............................. 257/59, 72, 350

(56) References Cited

U.S. PATENT DOCUMENTS 5,550,066 A * 8/1996 Tang et al. .................... 438/29

| | | | |
|---|---|---|---|
| 2003/0127652 A1 * | 7/2003 | Park et al. ..................... | 257/72 |
| 2003/0127657 A1 * | 7/2003 | Park ............................. | 257/79 |
| 2003/0160247 A1 * | 8/2003 | Miyazawa ..................... | 257/79 |
| 2004/0012028 A1 * | 1/2004 | Park et al. ..................... | 257/88 |

* cited by examiner

*Primary Examiner*—Ngân V. Ngâ
(74) *Attorney, Agent, or Firm*—Bacon & Thomas PLLC

(57) ABSTRACT

A thin-film-transistor organic electroluminescent device comprises: a substrate; a plurality of stripes of first conductive lines; a plurality of stripes of second conductive lines, intersecting the first conductive lines; a plurality of functional elements located at the intersections of the first conductive lines and the second conductive lines, including a transistor having a drain, a source and a gate; a cathode mounted on the surface of the substrate and connected to the drain; an anode mounted on the cathode; and at least one organic electroluminescent medium sandwiched between the cathode and the anode; wherein the cathode and the first conductive lines are made of the same material.

17 Claims, 2 Drawing Sheets

THIN-FILM-TRANSISTOR ORGANIC ELECTROLUMINESCENT DEVICE

BACKGROUND OF THE INVENTION

1. Field of the Invention

The present invention relates to an organic electroluminescent (OEL) display device, and more particularly to a thin-film-transistor (TFT) OEL device.

2. Description of Related Art

The display devices are very important interface for the communication between men and machines. In recent years, the flat panel display devices are widely used because of many advantages such as light-weight, low power consumption, mini-size and high compactness. For example, liquid crystal display devices with TFT switches made by amorphous silicon are very popular now. However owing to high requirements of the consumers, the liquid crystal display devices with TFT switches made by amorphous silicon cannot meet the requirement for rapid response time, high contrast, and high brightness. On the other hand, the OEL display devices with TFT switches made of LTPS (low temperature polysilicon) are display devices having the advantages to meet the market demand. However, there are lots of technical obstacles to be overcome.

So far, the present method for manufacturing the TFT OEL panels for display devices is achieved by forming LTPS TFT switches on a substrate first. Then cathodes or anodes of the OEL display devices are formed on the substrate after the LTPS TFT switches are available on the substrates. Subsequently, the organic electroluminescent medium (e,g, a hole injection layer, a hole transport layer, a light-emission layer, an electron transport layer, or an electron injection layer) and the other electrode (e.g. anode) is deposited on the substrate. However, the method illustrated above is time-consuming and lots of masks are needed.

Hence, it cannot be considered as an optimal method or design of integrating the LTPS TFT and the OLED techniques.

SUMMARY OF THE INVENTION

It is therefore an object of the present invention to provide a TFT-OEL device which combines the formation of the cathode material and the bus line of the LTPS panel into one processing step so as to increase the interface uniformity and the interface matching between the cathode material and the bus line and reduce the remaining stress.

Another object of the present invention to provide a TFT-OEL device which uses a low-resistance material such as aluminum or silver to reduce RC delay.

Another object of the present invention to provide a TFT-OEL device with a design of top-emitting structure (i.e. a cathode is close to the substrate) to significantly reduce the adverse effects such as interference, scattering and reflection caused by the transmission path of the emitting light in the layers and increase the luminescent efficiency and aperture ratio.

Another object of the present invention to provide a TFT-OEL device which combines the formation of the cathode material and the bus line of the LTPS panel into one processing step so as to increase the interface uniformity and the interface matching between the cathode material and the bus line, reduce the remaining stress, and even reduce at least one mask step of coating a cathode film on the OLED panel as involved in the conventional LTPS TFT panel process.

To attain the above-mentioned objects, a TFT-OEL panel according to the present invention comprises: a substrate; a plurality of stripes of first conductive lines mounted on the surface of said substrate; a plurality of stripes of second conductive lines mounted on the surface of said substrate, intersecting said first conductive lines; a plurality of functional elements located at the intersections of said first conductive lines and said second conductive lines, including a transistor having a drain, a source and a gate; a cathode mounted on the surface of said substrate and connected to said drain; an anode mounted over said cathode; and at least one organic electroluminescent medium sandwiched between said cathode and said anode; wherein said cathode and said first conductive lines are made of the same material; said first conductive lines and said second conductive lines are not directly electrically contacted at the intersections thereof; said source is connected to said first conductive lines; said gate is connected to said second conductive lines; said drain corresponding to said source is electrically connected to said source when an electric current flows through said gate; and said source, said gate and said drain are not directly electrically contacted at the intersection thereof.

To illustrate the present invention, exemplary embodiments of a TFT-OEL device will now be described with reference to the accompanying drawings.

DETAILED DESCRIPTION OF THE PREFERRED EMBODIMENT

Figure 1:
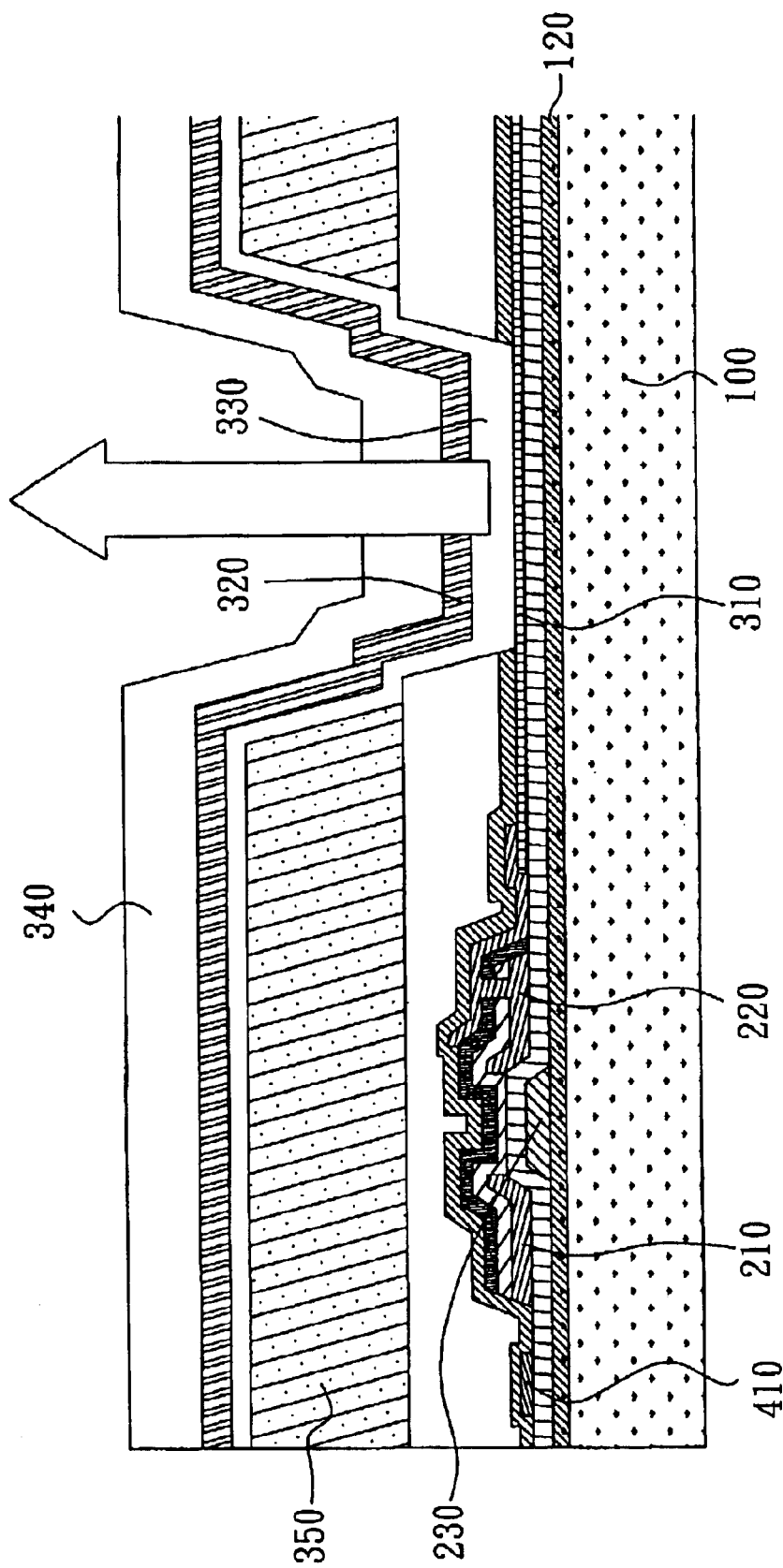
FIG. 1 is a cross-sectional view of the functional elements and the pixels of the TFT-OEL panel according to the present invention.

The substrate of the TFT-OEL panel of the present invention can be any conventional substrate for flat panel displays. Preferably, the substrates are glass, plastics, and transparent resins. More preferably, the plastic substrate can be a substrate made of the polycarbonate (PC), polyethylene terephthalate (PET), cycloolefin copolymer (COC) or metallocene-catalyzed-COC. The cathode of the TFT-OEL panel of the present invention can be made of any typical conductive electrode material. Preferably, the cathode of the present invention is made of a low-resistance metal. Most preferably, the cathode of the present invention is made of aluminum, silver, an aluminum-magnesium alloy or a silver-magnesium alloy. The anode of the TFT-OEL panel of the present invention is made of any typical electrode material. Preferably, the anode of the TFT-OEL panel of the present invention is made of a transparent conductive material. Most preferably, the anode of the TFT-OEL panel of the present invention is made of indium tin oxide (ITO) or aluminum zinc oxide (AZO). It is preferable that the source and the drain of the TFT-OEL panel according to the present invention are made of the same material, and more preferably, LTPS. The TFT-OEL panel has a typical organic electroluminescent medium. The organic electroluminescent medium of the panel of the present invention can be either made of small molecules or polymers. Preferably, the organic electroluminescent medium optionally includes an electron transport layer, an electron injection layer, a light-emission layer, a hole transport layer or a hole injection layer wherein the electron transport layer, the electron injection layer, the light-emission layer, the hole transport layer or the hole injection layer is interposed between the first display electrode and the second display electrode. It is preferable that at least one passivation layer should be formed between the first conductive lines and the second conductive lines of the TFT-OEL panel according to the present invention. The passivation layer can be any conventional passivation layer. Preferably, the passivation layer is a polyimide layer, an acrylic resin layer, a fluororesin layer, an epoxy layer or a silicon oxide layer. The relative arrangement of the gate, the source and the drain of the TFT-OEL panel according to the present invention can be any typical arrangement (e.g. bottom-gate arrangement or top-gate arrangement). Preferably, the gate is interposed between the source (or the drain) and the substrate (that is, bottom-gate arrangement). It is preferable that an isolation layer should be formed between the source and the gate of the TFT-OEL panel according to the present invention. The TFT-OEL panel according to the present invention may further comprise a buffer layer, if it's necessary. The buffer layer is mounted on the surface of the substrate to protect the substrate from moisture, oxygen or ions. Preferably, the buffer layer is made of silicon nitride, silicon oxide or oxysilicon nitride. In the method for fabricating the TFT-OEL substrate according to the present invention, any conventional processing step of forming α-Si on the substrate can be used. Preferably, α-Si is formed on the substrate by chemical vapor deposition (CVD). In the method for fabricating the TFT-OEL substrate according to the present invention, the conventional processing steps are used to pattern the source, the drain, the LDD (lightly doped drain) layer and the channel layer. Preferably, photolithography, ion-doping and ion implantation are used for forming pattern the source, the drain, the LDD layer and the channel layer. Most preferably, an excimer laser is used for annealing and activating the source, the drain, the LDD layer and the channel layer after photolithography, ion-doping and ion-implantation. The method for fabricating the TFT-OEL substrate according to the present invention can optionally further include processing steps of forming a patterned isolation layer on each transistor element for separating the patterned sources or drains from the patterned gates.

It is preferable that the TFT-OEL panel of the display devices according to the present invention is formed as a display panel having an array of a plurality of red, green and blue light-emitting pixels to display an image, and also, the TFT-OEL panel of the display devices according to the present invention may be formed as a monochromatic display panel having an array of light-emitting pixels, if it's so desired.

The TFT-OEL panel of the display devices fabricated according to the present invention can be applied to any environments or apparatus for displaying images, graphics, characters and text. Preferably, the TFT-OEL panel of the display devices fabricated according to the present invention is applied to the display interface of televisions, computers, printers, monitors, vehicles, to the display device of signal machines, communication apparatus, telephones, lamp equipments, headlights, interactive electronic books, microdisplay, fishing devices, personal digital assistant (PDA), game means, airplane equipments or head mounted display.

The present invention will be described with reference to a preferred embodiment of the OEL device and method for fabricating the same.

Figure 2:
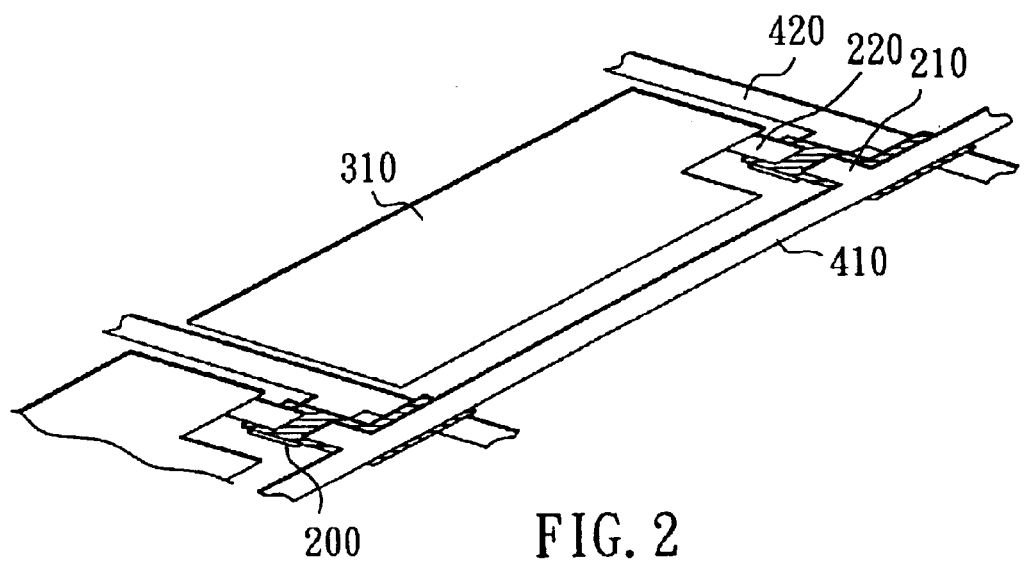
FIG. 2 is a schematic diagram of the TFT-OEL panel according to the present invention.
Figure 3:
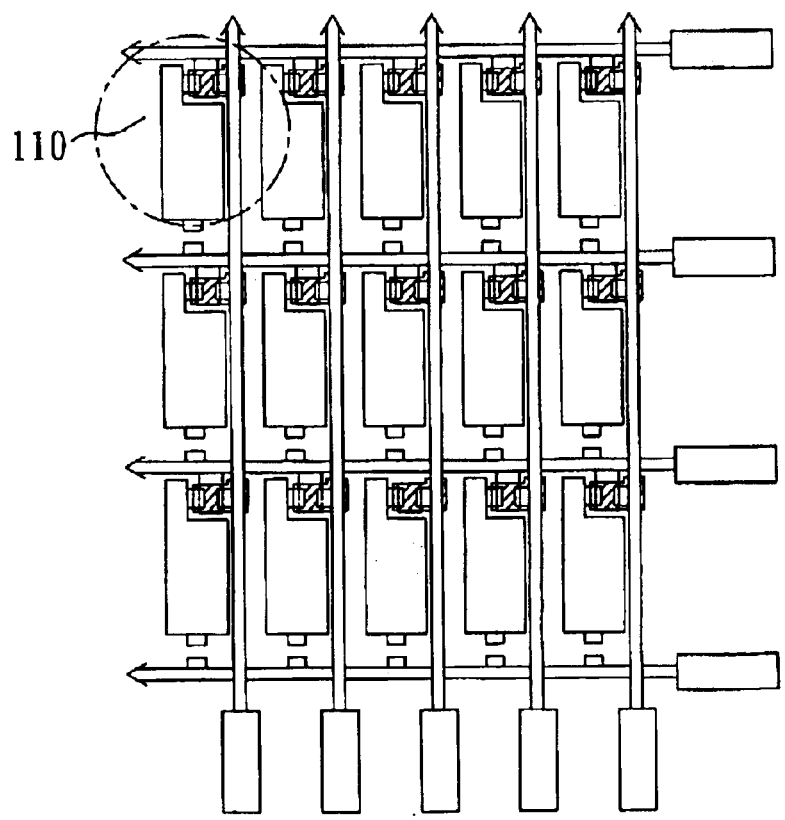
FIG. 3 is a schematic diagram of the pixel display units of the TFT-OEL substrate according to the present invention.

Referring to FIGS. 1, 2 and 3, FIG. 1 is a schematic view of the present invention. The OEL panel for a display device is a substrate 100 having a plurality of pixels 110. Each of the pixels 110 has a transistor element 200 and a display electrode element. The transistor element 200 is a TFT switch unit having a source 210, a gate 230 and a drain 220. In this preferred embodiment, the transistor element 200 is fabricated by photolithography and doping of the CMOS process on a substrate. The patterned sources and drains of the transistor elements 200 are formed through the processes of the conventional LTPS treatment, excimer laser annealing and activation. As shown in FIG. 1, the display electrode element of the pixels is formed on the surface of the substrate 100. At least two electrode layers 310, 320 and an organic electroluminescent medium 330 are also formed on the substrate for emitting light. In the structure of these electrode layers, the layer over the substrate surface is a cathode 310. An anode 320 is formed above the cathode 310 by sandwiching an organic electroluminescent medium 330 in-between. The cathode 310 and the anode 320 sandwich the organic electroluminescent medium 330. In this preferred embodiment, the cathode is made of aluminum, silver, an aluminum-magnesium alloy, a silver-copper alloy or a silver-magnesium alloy. The anode is a transparent ITO electrode or AZO. The cathode 310 of the display electrode element of the pixels is connected to the drain 220 of the transistor element 200 of the pixels so as to provide an electric current sufficient to drive the organic electroluminescent medium layer 330 of the display electrode element for luminance when the electric current flows through the source 210 to the drain 220.

A plurality of stripes of conductive lines are formed between the pixel display units 110 on the panel. The conductive lines can be divided into two sets. The first set of the conductive lines is a source conductive line 410 consisting of conductive lines being arranged parallel to one another. In this preferred embodiment, the conductive lines are formed as stripes parallel to each other. Each of the first set of the conductive lines is connected to the source 210 of the transistor element 200 of the pixel display units 110 to transmit a display signal. In this preferred embodiment, the first set of the conductive lines and the cathode 310 of the display electrode element are made of the same material. Preferably, they are made of aluminum, an aluminum-magnesium alloy, a silver-copper alloy or a silver-magnesium alloy in this preferred embodiment.

The second set of the conductive lines is a gate conductive line 420 consisting of conductive lines being arranged parallel to one another. In this preferred embodiment, the conductive lines are formed as stripes parallel to each other. Each of the second set of the conductive lines is connected to the gate 230 of the transistor element 200 of the pixel display units 110 to transmit a signal.

According to the method for fabricating OEL devices of the present invention, an α-Si layer is formed on the substrate 100. In this preferred embodiment, the α-Si layer is formed on the surface of a glass substrate by CVD. Then, the transistor element 200 is formed on the α-Si substrate in accordance with the CMOS process of the present invention.

The TFT element 200 can be made either by forming gates first or by forming sources (or drains) first. The sequence for formation of gates or that of sources (or drains) depends on the type (e.g. top-gate or bottom-gate) of TFTs on the substrate. In the present embodiment, the TFT elements 200 are bottom-gate TFTs. The TFT element 200 is formed by the CMOS process of the present invention includes the step of forming patterned gates by sputtering (or evaporation) and photolithography. The photolithography at least includes photoresist-coating, exposure, development and etching. After the gates are formed, a layer of isolation material is deposited, and the isolation layer is patterned by photolithography. Then, a LDD layer is patterned by photolithography, doping or ion implantation. The patterned sources and drains of the panel of the present invention are formed through sputtering (or evaporation) and photolithography. Then, the patterned source and drain are further annealed by excimer laser, and thus both patterned sources and drains are transformed from α-Si into polysilicon and the activation of dopants are achieved by radiation of excimer laser (e.g. from the bottom side of the gate) simultaneously. According to this process, the dopants implanted into the α-Si layer in advance can act as seeds to reduce the activation energy of crystallization and increase the efficiency of crystallization in the excimer laser annealing. Therefore, the thermal budget for fabricating the LTPS OEL TFT switches (or TFT elements) can be greatly reduced. Then, gate conductive lines 420 (the second conductive lines) are formed by photolithography. Further, a layer of the source conductive lines 410 and a material of the cathodes 310 are deposited wherein the main composition of the material of the source conductive line 410 and the cathode 310 is identical. In this preferred embodiment, the source conductive line 410 and the cathode 310 are made of the same material such as aluminum or silver, and the source conductive line 410 and the cathode 310 are patterned by photolithography. The source conductive lines 410 (the first conductive lines) are connected to the polysilicon sources 210 or drains 220. The drains 220 are connected to the cathode. Therefore, transistor elements 200 having the patterned gates 230, sources 210 and drains 220 are formed on the substrate. Then, the cathode 310 of the pixel, the source conductive line 410, the gate conductive line 420 of the panel are also formed on the substrate.

Subsequently, an adhesive dielectric layer 350 is deposited on the substrate surface for covering the surface areas except the cathode 310. The adhesive dielectric layer 350 is formed and patterned by photolithography for protect the transistor elements 200. Then, at least an organic electro luminescent medium layer is formed on the surface of the cathode of the pixel. The organic electroluminescent medium layer can be made of small molecules or polymers. The organic electroluminescent medium layer can optionally includes a hole injection layer, a hole transport layer, an organic electroluminescent medium layer, an electron transport layer and an electron injection layer. The organic electroluminescent medium layer is formed by evaporation in this preferred embodiment. After forming the organic electroluminescent medium layer, an anode 320 is formed on the top surface of the organic electroluminescent medium layer. In this embodiment, the anode 320 is a transparent electrode of ITO. After all the cathodes and anodes are formed, a layer of passivation 340 is deposited for protecting the whole layers and all the elements on the substrate of the OEL display panel.

The OEL device of the present invention combines conventional steps of the formation of the cathode material and the bus line of the LTPS panel into one processing step for coating a cathode film and the bus line of the LTPS panel on the OEL panel at the same time. Therefore, the formation of the present invention is different from the conventional LTPS TFT panel process since the steps of masking in the manufacturing process are reduced. Further, the OEL device according to the present invention use a low-resistance material such as aluminum (or an aluminum-magnesium alloy) or silver (or a silver-magnesium alloy) as the material of the bus line and the cathode so that the effect of RC delay can be effectively reduced. Compared with the typical LTPS TFT panel using chromium or molybdenum bus line, the effect of RC delay of the panel made through the method of the present invention is much less. Finally, the OEL devices of the present invention adopt a design of top light-emitting structure to significantly reduce the adverse effects such as interference, scattering and refraction caused by the disordered transmission path of the emitting light in the layers of a panel and increase the luminescent efficiency and aperture ratio when the cathode is close to the substrate.

Although the present invention has been explained in relation to its preferred embodiments, it is to be understood that many other possible modifications and variations can be made without departing from the spirit and scope of the invention as hereinafter claimed.

What is claimed is:

1. A thin-film-transistor organic electroluminescent device, comprising:

a substrate;

a plurality of stripes of first conductive lines mounted on the surface of said substrate;

a plurality of stripes of second conductive lines mounted on the surface of said substrate, intersecting said first conductive lines;

a plurality of functional elements located at the intersections of said first conductive lines and said second conductive lines, including a transistor having a drain, a source and a gate;

a cathode mounted on the surface of said substrate and connected to said drain;

an anode mounted over said cathode; and at least one organic electroluminescent medium sandwiched between said cathode and said anode;

wherein said cathode and said first conductive lines are made of the same material;

said first conductive lines and said second conductive lines are not directly electrically contacted at the intersections thereof;

said source is connected to said first conductive lines;

said gate is connected to said second conductive lines;

said drain corresponding to said source is electrically connected to said source when an electric current flows through said gate; and said source, said gate and said drain are not directly electrically contacted at the intersection thereof.

2. The thin-film-transistor organic electroluminescent panel as claimed in claim 1, further comprising a buffer layer on the surface of said substrate.

3. The thin-film-transistor organic electroluminescent panel as claimed in claim 1, wherein said buffer layer is made of silicon nitride, silicon oxide or oxysilicon nitride.

4. The thin-film-transistor organic electroluminescent panel as claimed in claim 1, wherein said cathode is aluminum or an aluminum-magnesium alloy.

5. The thin-film-transistor organic electroluminescent panel as claimed in claim 1, wherein said cathode is silver or a silver-magnesium alloy.

6. The thin-film-transistor organic electroluminescent panel as claimed in claim 1, wherein the main composition of said source and said drain are identical.

7. The thin-film-transistor organic electroluminescent panel as claimed in claim 1, wherein said organic electroluminescent medium further comprising an electron transport layer, an electron injection layer, a light-emission layer, a hole transport layer or a hole injection layer interposed between said cathode and said anode.

8. The thin-film-transistor organic electroluminescent panel as claimed in claim 1, wherein said anode is transparent.

9. The thin-film-transistor organic electroluminescent panel as claimed in claim 1, wherein said anode is indium tin oxide.

10. The thin-film-transistor organic electroluminescent panel as claimed in claim 1, wherein said anode is aluminum zinc oxide.

11. The thin-film-transistor organic electroluminescent panel as claimed in claim 1, wherein at least one passivation layer is sandwiched between said second conductive lines and said first conductive lines.

12. The thin-film-transistor organic electroluminescent panel as claimed in claim 1, wherein said passivation layer is a polyimide layer, an acrylic resin layer, a fluororesin layer, an epoxy layer or a silicon oxide layer.

13. The thin-film-transistor organic electroluminescent panel as claimed in claim 1, wherein said source and drain are made of polysilicon.

14. The thin-film-transistor organic electroluminescent panel as claimed in claim 1, wherein said source and said drain are interposed between said gate and said substrate.

15. The thin-film-transistor organic electroluminescent panel as claimed in claim 1, wherein said source and said gate sandwich an isolation layer.

16. The thin-film-transistor organic electroluminescent panel as claimed in claim 1, wherein said substrate is made of glass, plastics, and transparent resins.

17. The thin-film-transistor organic electroluminescent panel as claimed in claim 1, wherein said substrate is made of polycarbonate, PET, cycloolefin copolymer (COC) or metallocene-COC.

* * * * *